(12) United States Patent
Nakamura

(10) Patent No.: US 10,043,439 B2
(45) Date of Patent: Aug. 7, 2018

(54) DISPLAY DEVICE

(71) Applicant: Japan Display Inc., Tokyo (JP)

(72) Inventor: Tomoki Nakamura, Tokyo (JP)

(73) Assignee: Japan Display Inc., Tokyo (JP)

( * ) Notice: Subject to any disclaimer, the term of this patent is extended or adjusted under 35 U.S.C. 154(b) by 267 days.

(21) Appl. No.: 14/937,088

(22) Filed: Nov. 10, 2015

(65) Prior Publication Data
US 2016/0133181 A1 May 12, 2016

(30) Foreign Application Priority Data
Nov. 10, 2014 (JP) .................................. 2014-227839

(51) Int. Cl.
| | |
|---|---|
| *G09G 3/32* | (2016.01) |
| *H01L 51/52* | (2006.01) |
| *G09G 3/36* | (2006.01) |
| *H01L 27/32* | (2006.01) |

(52) U.S. Cl.
CPC ........... *G09G 3/32* (2013.01); *H01L 51/5228* (2013.01); *G09G 3/3655* (2013.01); *G09G 2300/0426* (2013.01); *G09G 2300/0452* (2013.01); *H01L 27/322* (2013.01); *H01L 27/3213* (2013.01); *H01L 27/3218* (2013.01); *H01L 27/3246* (2013.01)

(58) Field of Classification Search
CPC ........................................... G09G 2300/04399
See application file for complete search history.

(56) References Cited

U.S. PATENT DOCUMENTS

| | | | | |
|---|---|---|---|---|
| 2001/0028060 A1* | 10/2001 | Yamazaki | ............ | G09G 3/3233 257/72 |
| 2002/0024493 A1* | 2/2002 | Ozawa | ................. | G09G 3/3233 345/92 |
| 2003/0155943 A1* | 8/2003 | Morishita | .............. | G09G 3/006 324/754.03 |
| 2005/0001846 A1* | 1/2005 | Shiono | ................. | G09G 3/3611 345/531 |
| 2005/0128384 A1* | 6/2005 | Song | ................. | G02F 1/133504 349/110 |
| 2006/0066534 A1* | 3/2006 | Shirasaki | ............... | G09G 3/325 345/76 |
| 2007/0215888 A1* | 9/2007 | Mitsuhashi | .......... | G09G 3/3225 257/94 |

(Continued)

FOREIGN PATENT DOCUMENTS

JP 2009-276721 A 11/2009

*Primary Examiner* — William Lu
(74) *Attorney, Agent, or Firm* — Typha IP LLC

(57) ABSTRACT

A display device includes a display area including a plurality of pixels located in a matrix. The plurality of pixels include first sub pixels and second sub pixels, the second sub pixels being adjacent to the first sub pixels. The display device further comprises a plurality of assisting lines formed between the first sub pixels and the second sub pixels, the areas not overlapping the openings of the banks as seen in a plan view. As seen in a cross-sectional view, regarding each of the first sub pixels and the second sub pixel adjacent thereto, a distance between an edge of the opening of the bank demarcating the first sub pixel and a corresponding assisting line, among the assisting lines, is longer than a distance between an edge of the opening of the bank demarcating the second sub pixel and the corresponding assisting line.

16 Claims, 25 Drawing Sheets

(56) References Cited

U.S. PATENT DOCUMENTS

| | | | |
|---|---|---|---|
| 2008/0062386 A1* | 3/2008 | Ito | H04N 9/3108 |
| | | | 353/31 |
| 2009/0170230 A1* | 7/2009 | Kidu | H01L 27/3211 |
| | | | 438/35 |
| 2009/0290080 A1* | 11/2009 | Horiuchi | G02B 5/201 |
| | | | 349/38 |
| 2015/0092133 A1* | 4/2015 | Kajita | G02F 1/136209 |
| | | | 349/46 |

* cited by examiner

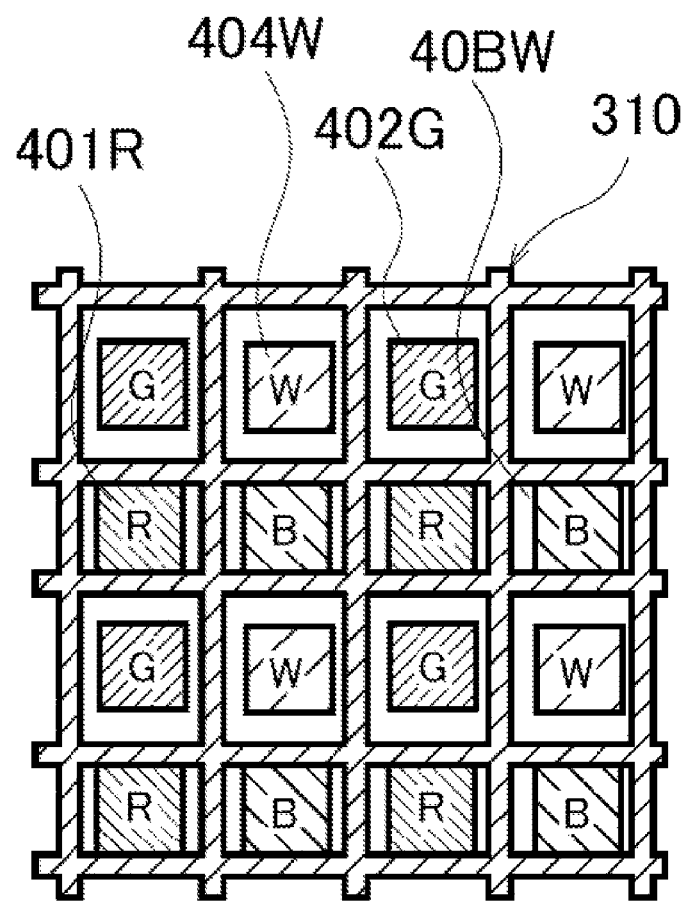

DISPLAY DEVICE

CROSS-REFERENCE TO RELATED APPLICATIONS

This application is based upon and claims the benefit of priority from the prior Japanese Patent Application No. 2014-227839, filed on Nov. 10, 2014, the entire contents of which are incorporated herein by reference.

FIELD

The present invention relates to a display device, and specifically, to an EL display device effectively preventing color mixing between pixels located adjacent to each other.

BACKGROUND

As a light emitting element using an electroluminescence phenomenon, an electroluminescence (hereinafter, referred to as "EL") element is known. An EL element is capable of emitting light of a color of any of various wavelengths in accordance with a light emitting material selected to form a light emitting layer, and is now applied more and more for a display device, an illumination device and the like. Especially, an organic EL element using an organic material as the light emitting material is now a target of attention.

A display device using an organic EL element includes the organic EL element acting as a light emitting element and a switching element that controls light emission performed by the EL element, in each of pixels located in a matrix on a substrate. The switching element is controlled on a pixel-by-pixel basis, so that an arbitrary image is displayed on the entirety of a display area.

As a display form of a display device, two types of form, namely, a top emission type and a bottom emission type, are known. With a top emission type display device, light that is emitted by an organic EL element is reflected by a pixel electrode and output outside. With a bottom emission type display device, light that is emitted by an organic EL element is transmitted through the pixel electrode and output outside. Especially, the top emission type display device is advantageous in having a high numerical aperture of the pixels.

With the top emission type display device, light needs to be transmitted through a common electrode (cathode) that forms a pair with a pixel electrode (anode) before being output outside. Therefore, the top emission type display device often uses a thin film formed of MgAg (magnesium-silver alloy) or a transparent conductive film formed of ITO (indium tin oxide), IZO (indium zinc oxide) or the like as a common electrode.

Among these films, the transparent conductive film formed of ITO, IZO or the like has a higher resistance that that of a metal film. Therefore, in the case where the level of current consumed by the display area is high because of a large size of the screen, a significant voltage drop is caused in, or in the vicinity of a central area, namely, an area far from the current supply source. This influences the display.

Japanese Laid-Open Patent Publication No. 2009-276721 discloses a technology of adjusting the resistivity of a transparent conductive film formed of ITO, IZO or the like in order to solve such a problem. This technology is to provide a low-resistance material on a cathode to form an assisting line layer.

SUMMARY

A display device in an embodiment according to the present invention includes a display area including a plurality of pixels located in a matrix. The plurality of pixels include first sub pixels emitting light of a first color and second sub pixels emitting light of a second color, the second sub pixels being adjacent to the first sub pixels. The first sub pixels and the second sub pixels each include a pixel electrode provided on a surface of an insulating layer; and a bank covering an edge of the pixel electrode and having an opening on the pixel electrode. The display device further comprises an EL layer provided above the openings; a counter electrode provided to cover the EL layer; and a plurality of assisting lines formed in areas of the counter electrode between the first sub pixels and the second sub pixels, the areas not overlapping the openings of the banks as seen in a plan view. As seen in a cross-sectional view, regarding each of the first sub pixels and the second sub pixel adjacent thereto, a distance between an edge of the opening of the bank demarcating the first sub pixel and a corresponding assisting line, among the plurality of assisting lines, is longer than a distance between an edge of the opening of the bank demarcating the second sub pixel and the corresponding assisting line.

A display device in another embodiment according to the present invention includes a display area including a plurality of pixels located in a matrix. The plurality of pixels include first sub pixels emitting light of a first color and second sub pixels emitting light of a second color, the second sub pixels being adjacent to the first sub pixels. The first sub pixels and the second sub pixels each include a pixel electrode provided on a surface of an insulating layer; and a bank covering an edge of the pixel electrode and having an opening on the pixel electrode. The display device further comprises an EL layer provided above the openings; a counter electrode provided to cover the EL layer; and a plurality of assisting lines formed in areas not overlapping the openings of the banks as seen in a plan view. As seen in a cross-sectional view, a distance between assisting lines, among the plurality of assisting lines, having the first sub pixels therebetween is longer than a distance between assisting lines, among the plurality of assisting lines, having the second sub pixels therebetween.

BRIEF DESCRIPTION OF DRAWINGS

FIG. 6D is a plan view showing a positional relationship between the sub pixels and the assisting lines of the display device in the still another embodiment according to the present invention;

DESCRIPTION OF EMBODIMENTS

Figure 1:
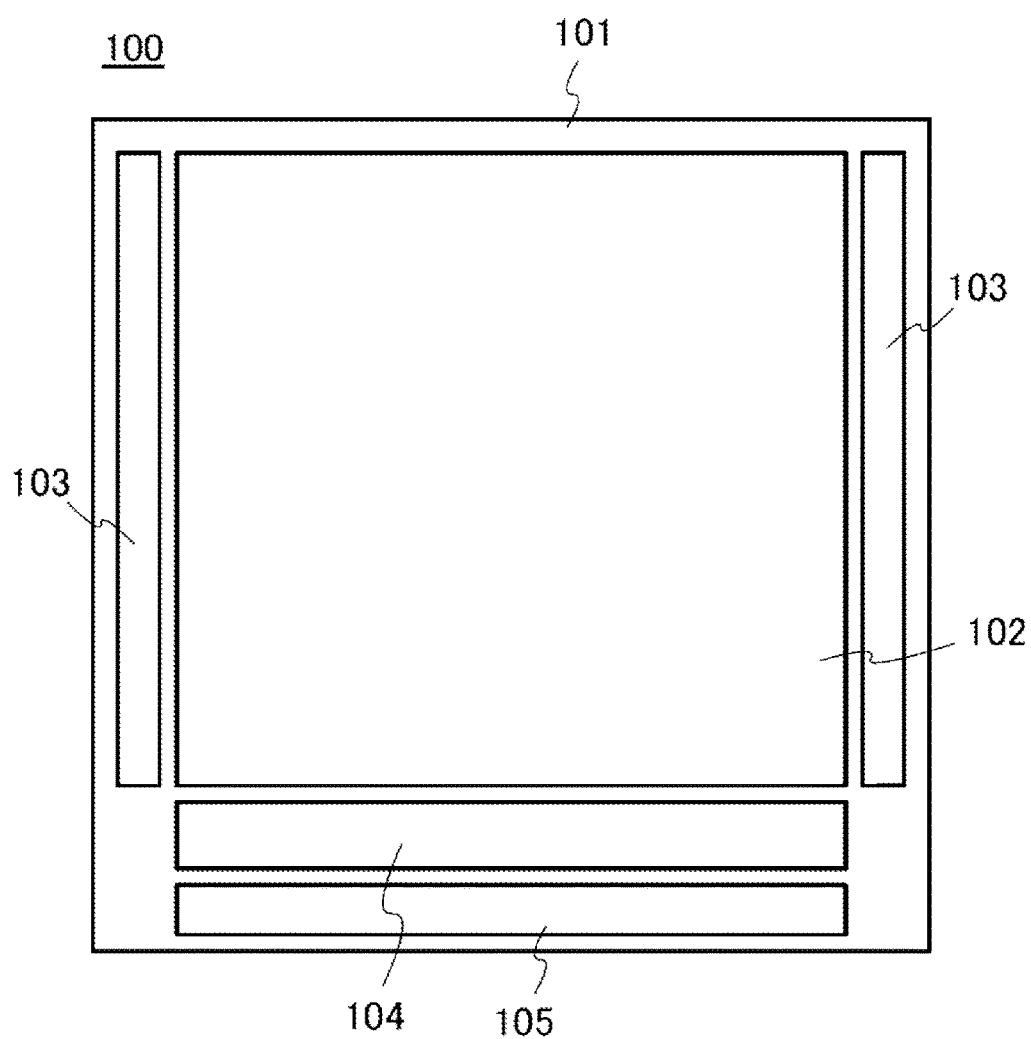
FIG. 1 is a plan view showing an overall structure of a display device in embodiment 1 according to the present invention.

Hereinafter, embodiments of the present invention will be described with reference to the drawings. The disclosure is merely exemplary, and alternations and modifications easily conceivable by a person of ordinary skill in the art without departing from the gist of the present invention are duly encompassed in the scope of the present invention. In the drawings, components may be shown schematically regarding the width, thickness, shape and the like, instead of being shown in accordance with the actual sizes, for the sake of clear illustration. The drawings are merely exemplary and do not limit the interpretations of the present invention in any way. In the specification and the drawings, components that are substantially the same as those shown in a previous drawing(s) bear the identical reference signs thereto, and detailed descriptions thereof may be omitted.

In the case where an organic EL element is used as a display element, functional layers such as a hole transfer layer, an electron transfer layer and the like are formed in addition to the light emitting layer. The light emitting layer may be formed by either of the following methods. According to one method, a light emitting layer of a single color, for example, a white light emitting layer, is formed uniformly over a plurality of pixels, and various different colors are provided by use of color conversion layers such as color filters or the like. According to the other method, an element for each color of light is formed in each pixel, and the corresponding color of light is provided from each pixel. Whichever method may be used, the above-described functional layers are often formed uniformly over the plurality of pixels.

Namely, each of the functional layers is physically continuous between the pixels adjacent to each other. Therefore, when a current is supplied to a certain pixel to cause light emission, the current supplied from the corresponding pixel electrode is transmitted laterally in the functional layers to reach the light emitting layer of an adjacent pixel, and light is emitted from the adjacent pixel which is not to emit light. This is called electrical color mixing, and is considered as a problematic cause of reduction of display quality.

The present invention has an object of providing an EL display device effectively preventing color mixing between pixels located adjacent to each other.

Embodiment 1

With reference to FIG. 1 through FIG. 4B, a structure of a display device 100 in embodiment 1 according to the present invention will be described.

FIG. 1 is a plan view showing an overall structure of the display device 100 in embodiment 1 according to the present invention. The display device 100 includes a pixel area (display area) 102, a scanning line driving circuit 103, a data line driving circuit 104, and a driver IC 105, which are provided on a substrate 101. The driver IC 105 acts as a control unit that provides signals to the scanning line driving circuit 103 and the data line driving circuit 104.

In the example shown in FIG. 1, the driver IC 105 is formed integrally on the substrate 101. Alternatively, the driver IC 105 may be provided as an element separate from the substrate 101, for example, an IC chip and may be located on the substrate 101. Still alternatively, the driver IC 105 may be provided on a flexible printed circuit, and the flexible printed circuit may be attached to the substrate 101 as an external unit.

In FIG. 1, the pixel area 102 includes a plurality of pixels 201 (shown in FIG. 2) located in a matrix. The pixels 201 are each supplied with a data signal in accordance with image data from the data line driving circuit 104. The data signals are then supplied to corresponding pixel electrodes via switching elements provided in the respective pixels 201. Thus, an image in accordance with the image data is displayed. As the switching elements, thin film transistors are typically usable. The switching elements are not limited to the thin film transistors, and may be any elements having a switching function.

Figure 2:
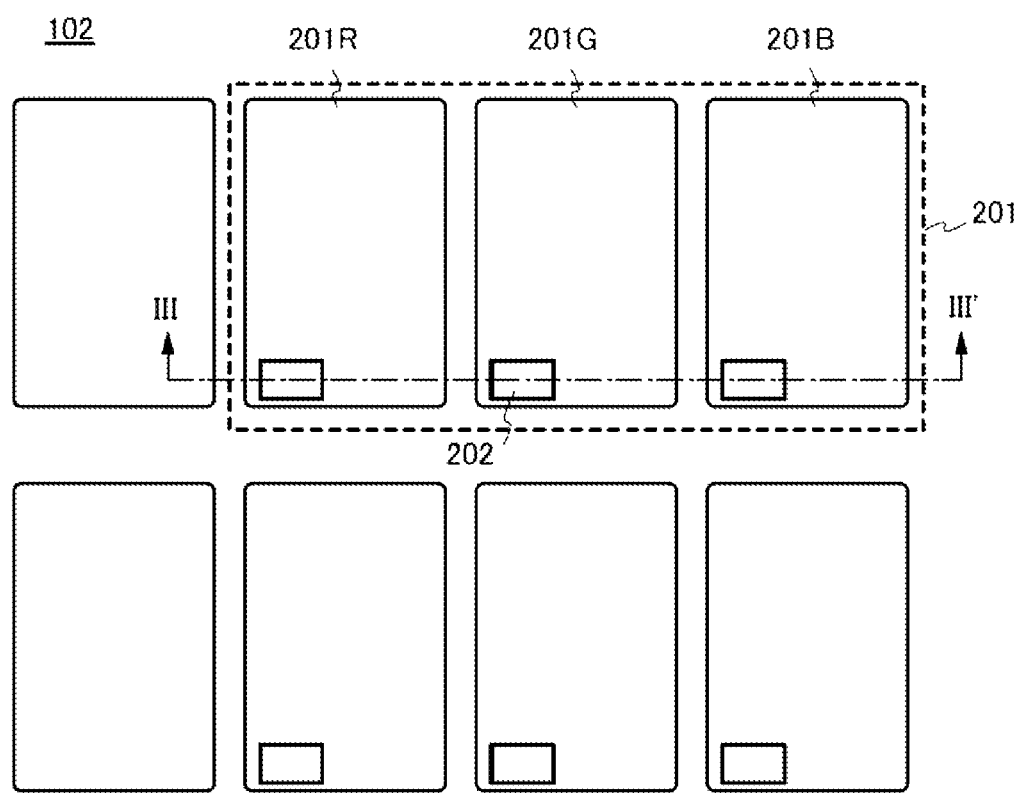
FIG. 2 shows a structure of a pixel area of the display device in embodiment 1 according to the present invention.

FIG. 2 shows a structure of the pixel area 102 of the display device 100 shown in FIG. 1. In this embodiment, the pixels 201 each include a sub pixel 201R corresponding to red (R), a sub pixel 201G corresponding to green (G), and a sub pixel 201B corresponding to blue (B). Each of the sub pixels includes a thin film transistor 202 as a switching element. The thin film transistor 202 is used to control the corresponding sub pixel 201R, 201G or 201B to emit light or not to emit light. Thus, light of the color corresponding to any of the sub pixels is emitted, so that the pixel 201 provides any of various colors.

In the example shown in FIG. 2, the sub pixels correspond to three primary colors of RGB. This embodiment is not limited to using such colors, and the pixel 201 may include four sub pixels corresponding to the RGB colors and white (W) or yellow (Y). In the example shown in FIG. 2, the sub pixels corresponding to the same color are located in a line so that a striped pattern is provided by all the sub pixels. Alternatively, the sub pixels may be located in a delta arrangement, a Bayer arrangement or a pen tile matrix. The positional relationship between the sub pixels and assisting lines will be described later.

Figure 3:
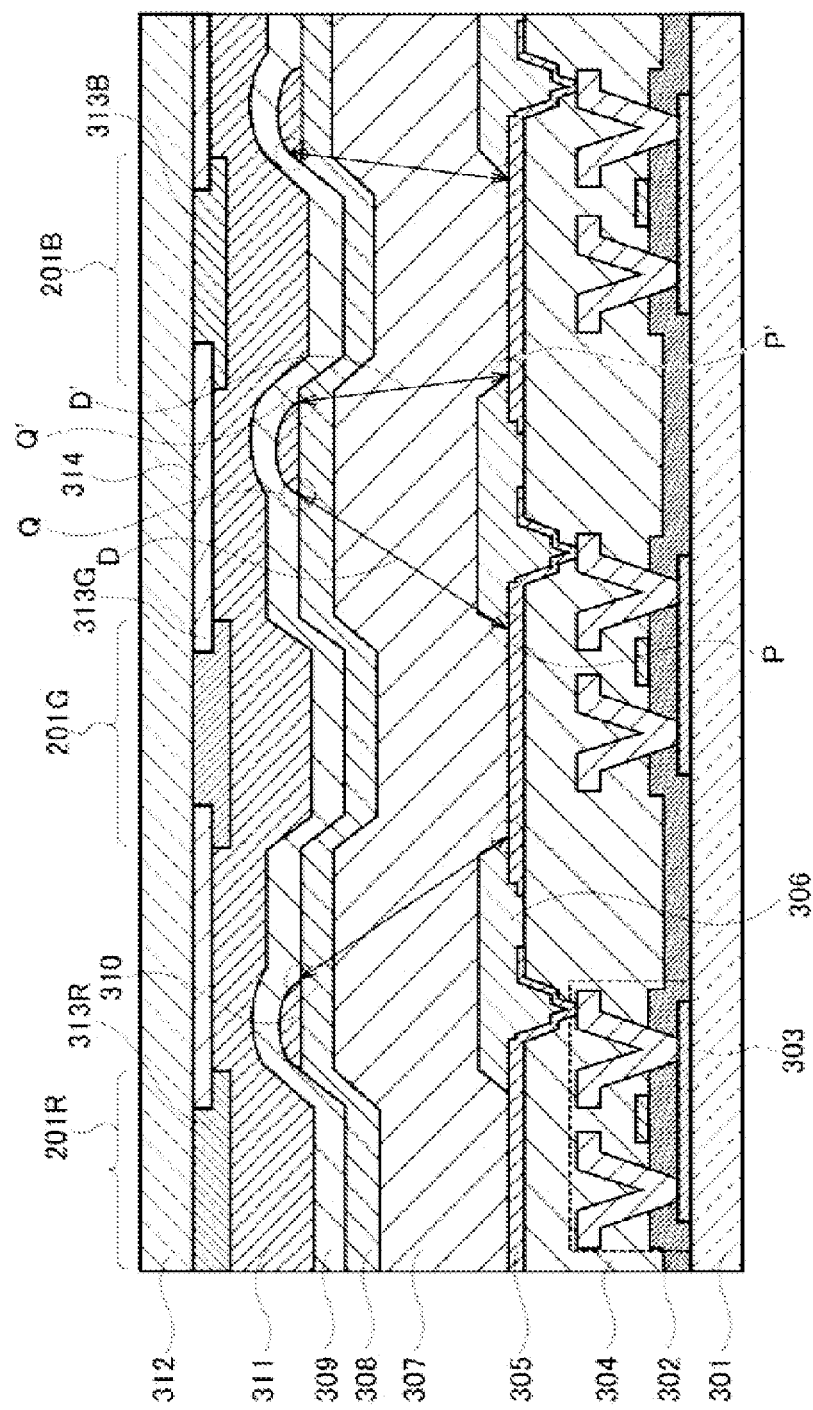
FIG. 3 is a cross-sectional view showing a cross-sectional structure of a pixel of the display device in embodiment 1 according to the present invention, taken along line III-III' shown in FIG. 2.

FIG. 3 is a cross-sectional view showing a cross-sectional structure of the pixel 201 shown in FIG. 2 taken along line III-III'.

As shown in FIG. 3, thin film transistors 303 are provided on the first substrate 301.

The first substrate 301 may be a glass substrate, a quartz substrate, or a flexible substrate (formed of a bendable material such as polyimide, polyethyleneterephthalate, polyethylenenaphthalate or the like). In the case where the first substrate 301 does not need to be light-transmissive, the first substrate 301 may alternatively be a metal substrate, a ceramic substrate or a semiconductor substrate.

The thin film transistors 303 may be formed of a known method. The thin film transistors 303 may be of a top gate type or a bottom gate type. A gate insulating film 302 is formed of, for example, silicon oxide, silicon nitride or the like and is located between a semiconductor layer and a gate electrode. The display device 100 in this embodiment has a structure in which a first insulating layer 304 is provided so as to cover the thin film transistors 303, more specifically, so as to cover a convexed and concaved surface of the thin film transistors 303 and to provide a flat surface. The first insulating layer 304 is preferably formed of a resin material. For example, the first insulating layer 304 may be formed of a known organic material such as polyimide, polyamide, acrylic resin, epoxy or the like. Alternatively, the first insulating layer 304 may be formed of an inorganic material such as silicon oxide or the like, instead of an organic material, or may have a stack structure of an organic film and an inorganic film, as long as the flattening effect is provided.

In the example shown in FIG. 3, the first insulating layer 304 is a single layer. Alternatively, the first insulating layer 304 may include two separate layers located above and below source/drain electrodes of the thin film transistors 303, and these two layers may be formed of different materials.

On the first insulating layer 304, pixel electrodes 305 are provided. The pixel electrodes 305 are respectively connected with the thin film transistors 303 via contact holes formed in first insulating layer 304. In the display device 100 in this embodiment, the pixel electrodes 305 each act as an anode of an organic EL element.

The pixel electrodes 305 have a different structure in the case where the display device 100 is of the top emission type from in the case where the display device 100 is of the bottom emission type. In the case where, for example, the display device 100 is of the top emission type, the pixel electrodes 305 may each be formed of a metal film having a high reflectance or may each have a stack structure of a transparent conductive film formed of a material having a high work function, for example, an indium oxide-based material or a zinc oxide-based material, and a metal film. By contrast, in the case where the display device 100 is of the bottom emission type, the pixel electrodes 305 may each be formed of a transparent conductive film as described above. In this embodiment, the display device 100 of the top emission type will be described as an example.

As shown in FIG. 3, a bank 306 is provided over each two adjacent pixel electrodes 305. More specifically, the banks 306 are each provided so as to cover edges of each two adjacent pixel electrodes 305. The banks 306 are also provided so as to have openings at positions on the pixel electrodes 305. As a result, the banks 306 act as members that demarcate the sub pixels. The banks 306 may each act as a filler that fills a recessed portion caused by the contact hole in addition to covering the edges of the pixel electrodes 305.

In this embodiment, the banks 306 may be formed of a known resin material, for example, a polyimide-based, a polyamide-based, an acrylic-based, an epoxy-based or a siloxane-based resin. The banks 306 are not limited to being shaped as shown in FIG. 3. A cross-section of each bank 306 including an apex thereof (cross-section taken along a plane vertical to a surface of the pixel electrode 305) may have a curved profile, or the bank 306 may have any other shape.

On the pixel electrodes 305 and the banks 306, an electroluminescence layer (EL layer) 307 is provided. The EL layer 307 includes at least a light emitting layer and acts as a light emitting unit of the organic EL element. The EL layer 307 may include various functional layers such as an electron injection layer, an electron transfer layer, a hole injection layer and a hole transfer layer, in addition to the light emitting layer. These layers are formed of an organic material having a low molecular weight or high molecular weight. The light emitting layer may be formed of electroluminescence type quantum dots instead of an organic material.

In this embodiment, the EL layer 307 emit white light, and color separation is performed by use of color filters described later. The EL layer 307 may be formed of a material having a wide range of light emission spectrum over a visible wavelength region so as to emit white light, or may be formed of a plurality of materials each having a peak of spectrum at a specific wavelength, so as to emit white light as a combination of light of a plurality of colors. An example of the latter type of the EL layer 307 may include a combination of a light emitting layer that emits blue light and a light emitting layer that emits yellow light, or may use any other known structure or material.

On the EL layer 307, a common electrode 308 acting as a cathode of the organic EL element is provided. Since the display device 100 in this embodiment is of the top emission type, the common electrode 308 acts as a transparent electrode. For example, the common electrode 308 may be formed of a metal material such as MgAg or the like as a film that is sufficiently thin to be light-transmissive, or may be formed of a transparent conductive film (ITO film or IZO film). The common electrode 308 is provided on the entirety of the pixel area 102 over the pixels 201.

In the display device 100 in this embodiment, assisting lines 310 are provided on areas of the common electrode 308 that do not overlap the openings of the banks 306 as seen in a plan view. Namely, the assisting lines 310 are provided between the sub pixels.

The assisting lines 310 may be formed of a conductive material such as a metal colloid or a metal nanowire containing silver (Ag), titanium (Ti) and the like. Alternatively, the assisting lines 310 may be formed of a conductive material such as carbon black or the like. Such a conductive material is dispersed in a volatile solvent and is selectively applied to the areas where the assisting lines 310 are to be formed. Then, the solvent is removed. In this manner, the assisting lines 310 formed of a conductive material as described above are formed. Needless to say, any other known line formation technique including a patterning step may be used as long as the common electrode 308 is not damaged.

In the display device 100 in this embodiment, the areas where the assisting lines 310 are provided are closer to the sub pixel 201R or 201B than to the sub pixel 201G adjacent thereto as seen in a cross-sectional view. Specifically, regarding the assisting line 310 provided between each sub pixel 201G and the sub pixel 201B adjacent thereto, distance D between an edge of the opening of the bank 306 demarcating the sub pixel 201G and the assisting line 310 is longer than distance D' between an edge of the opening of the bank 306 demarcating the sub pixel 201B and the assisting line 310.

The edge of the opening of the bank 306 demarcating the sub pixel 201G, which is the starting point of distance D, is point P shown in FIG. 3, namely, the point, of a circumferential edge of the opening of the bank 306 demarcating the sub pixel 201G, that is closest to the assisting line 310 formed between the sub pixel 201G and the sub pixel 201B. The assisting line 310, which is the end point of distance D, is point Q. Point Q is in an area of the assisting line 310 that is in contact with the cathode and is closest to the edge of the opening of the bank 306 demarcating the sub pixel 201G, which is the starting point of distance D.

The edge of the opening of the bank 306 demarcating the sub pixel 201B, which is the starting point of distance D', is point P' shown in FIG. 3, namely, the point, of a circumferential edge of the opening of the bank 306 demarcating the sub pixel 201B, that is closest to the assisting line 310 formed between the sub pixel 201G and the sub pixel 201B. The assisting line 310, which is the end point of distance D', is point Q'. Point Q' is in an area of the cathode of the assisting line 310 that is in contact with the cathode and is closest to the edge of the opening of the bank 306 demarcating the sub pixel 201B, which is the starting point of distance D'.

In the display device 100 in this embodiment, the resistance value of the cathode in a pixel pitch direction is about 1000 times the resistance value of the cathode in a film thickness direction; in other words, the film thickness of the cathode is about $\frac{1}{1000}$ of the sub pixel pitch. The cathode itself is intentionally set to have a high resistance with respect to the required current level of the display area. The resistance value on the cathode side is decreased by the assisting lines. This will be described later with reference to FIG. 4A and FIG. 4B.

Above the assisting lines 310, a sealing substrate is provided, with a sealing film 309 acting as a protective film for the organic EL element and a filler 311 being provided between the sealing substrate and the assisting lines 310. The filler 311 may be formed of a known resin material, for example, a polyimide-based, a polyamide-based, an acrylic-based, an epoxy-based or a siloxane-based resin. The filler 311 is provided in order to fill a gap between the sealing substrate and the components provided on the substrate 301 including the thin film transistors 303 and the organic EL element. The filler 311 may also act as an adhesive that bonds the sealing substrate and the components provided on the substrate 301.

In this embodiment, the "sealing substrate" includes a second substrate 312, color filters 313R, 313G and 313B, respectively corresponding to the RGB colors, provided on a main surface of the second substrate 312 (surface facing the first substrate 301), and a black matrix 314 provided in gaps between the color filters 313R, 313G and 313B.

The sealing substrate is not limited to having such a structure, and the black matrix 314 may be omitted. The color filters 313R, 313G and 313B may be omitted in the case where the EL layer 307 includes areas respectively corresponding to the RGB colors. In the case where the color filters 313R, 313G and 313B are omitted or provided on the first substrate 301 side, the sealing substrate itself may be omitted.

Figure 4A:
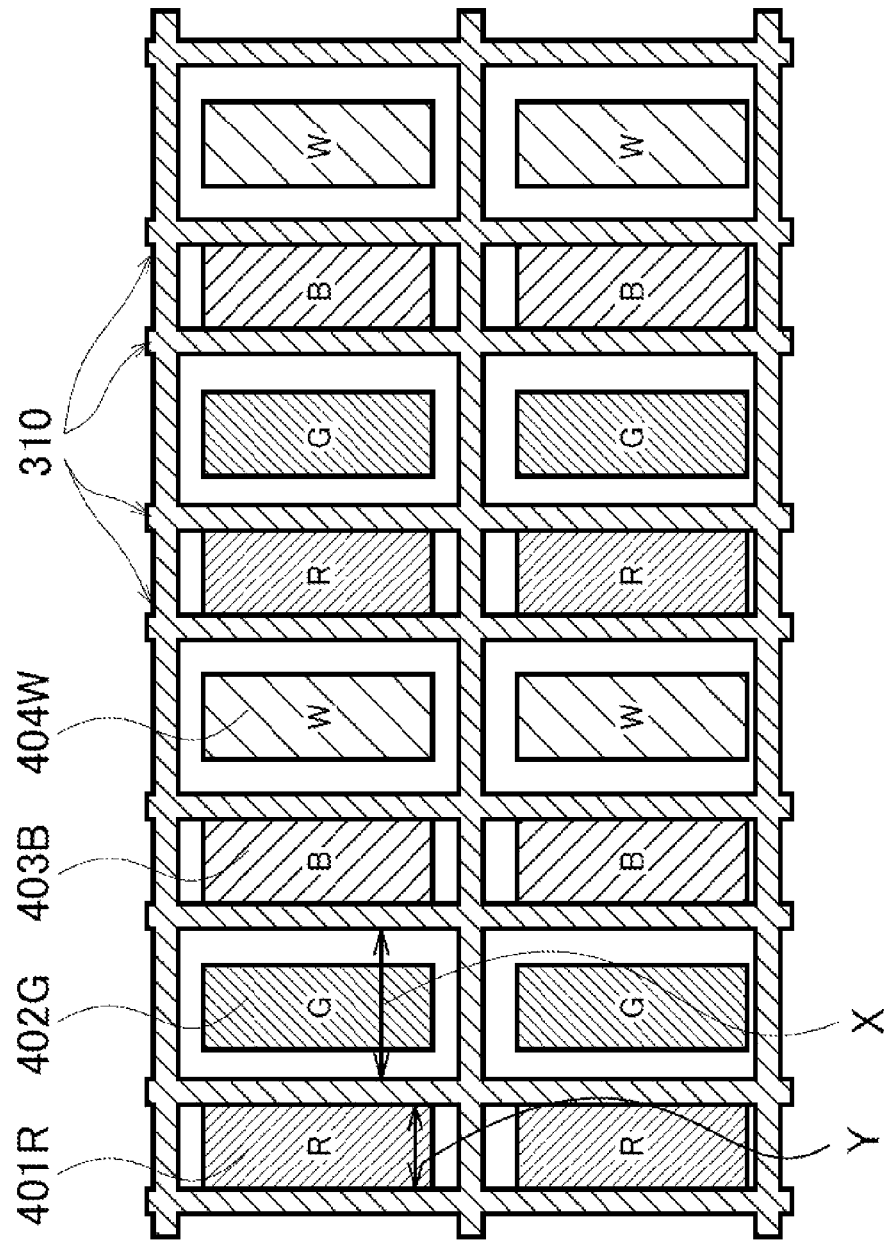
FIG. 4A is a plan view showing a positional relationship between sub pixels and assisting lines of the display device in embodiment 1 according to the present invention.
Figure 4B:
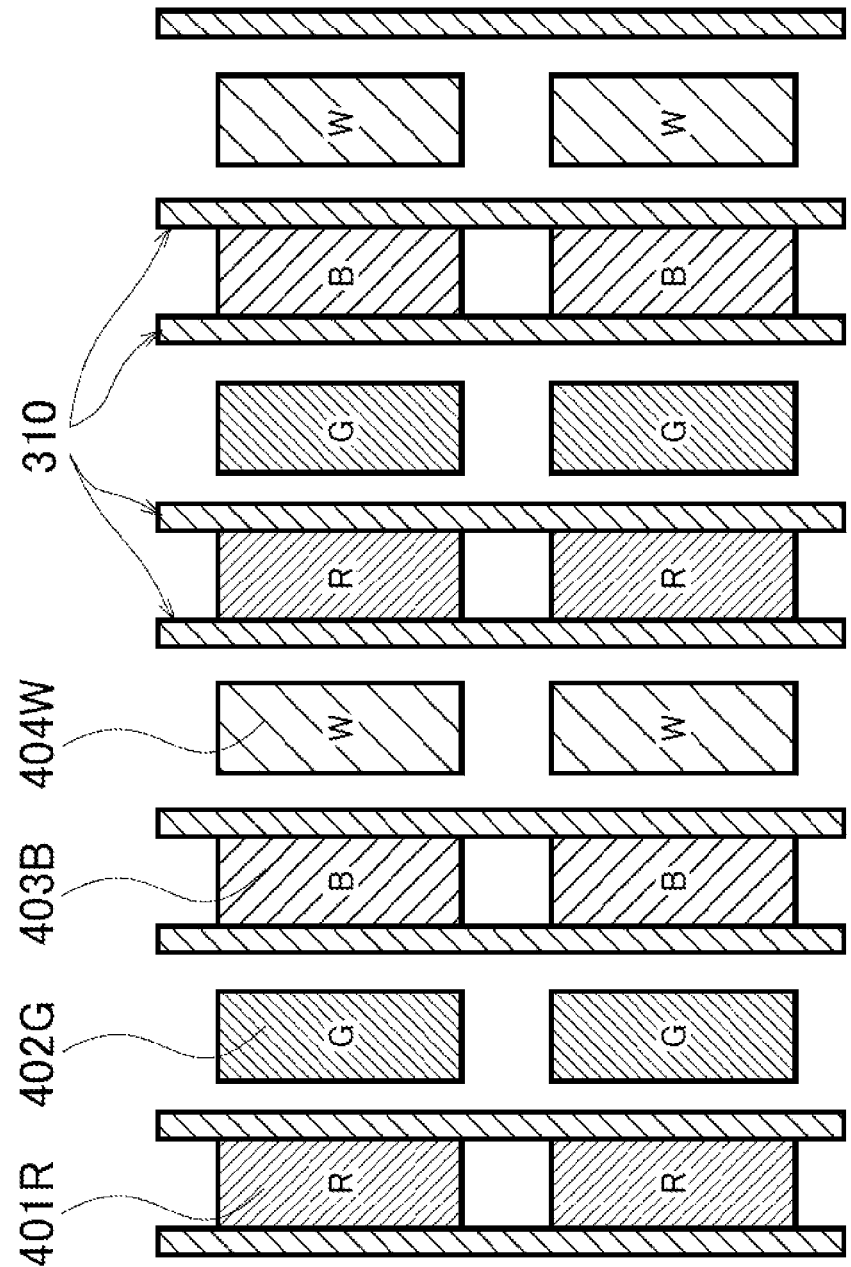
FIG. 4B is a plan view showing a positional relationship between the sub pixels and the assisting lines of the display device in embodiment 1 according to the present invention.
Figure 5A:
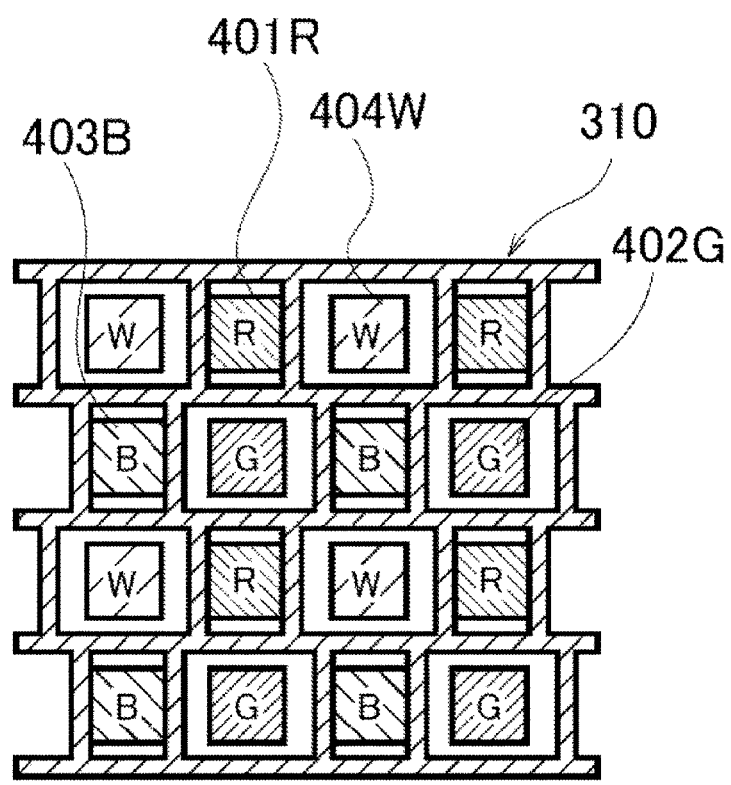
FIG. 5A is a plan view showing a positional relationship between sub pixels and assisting lines of a display device in another embodiment according to the present invention.
Figure 5B:
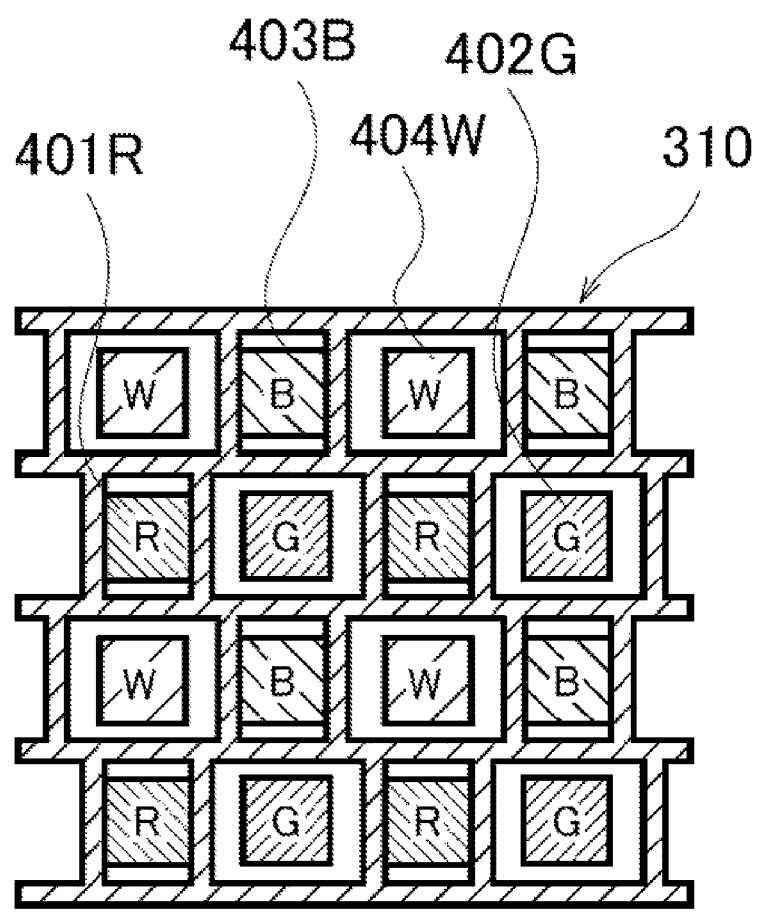
FIG. 5B is a plan view showing a positional relationship between the sub pixels and the assisting lines of the display device in the another embodiment according to the present invention.
Figure 5C:
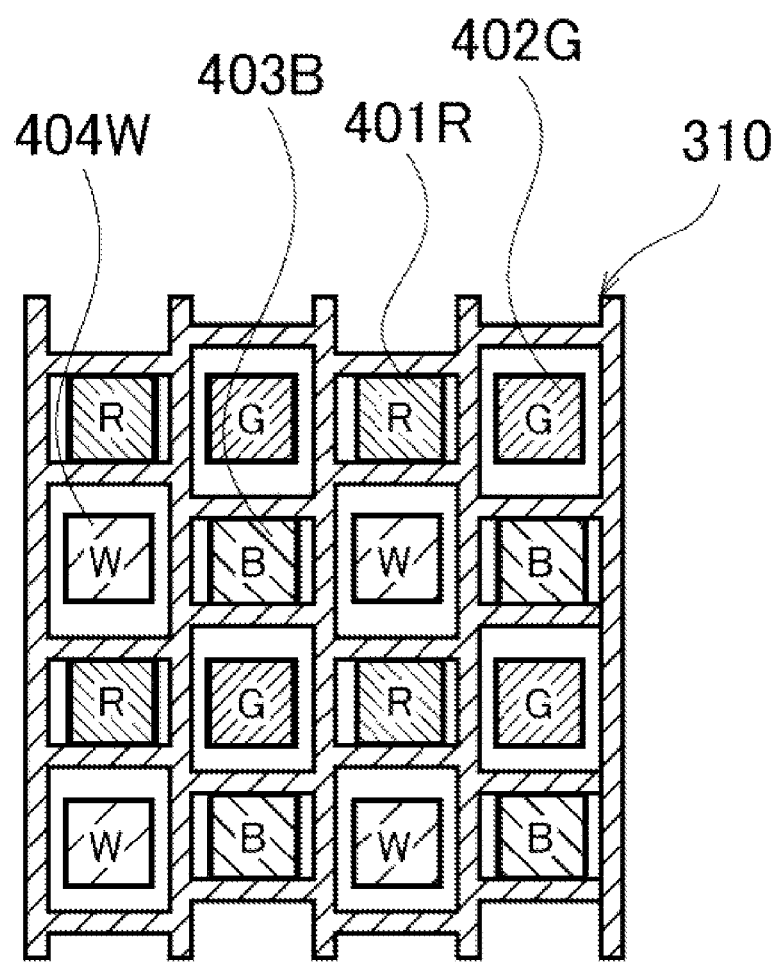
FIG. 5C is a plan view showing a positional relationship between the sub pixels and the assisting lines of the display device in the another embodiment according to the present invention.
Figure 5D:
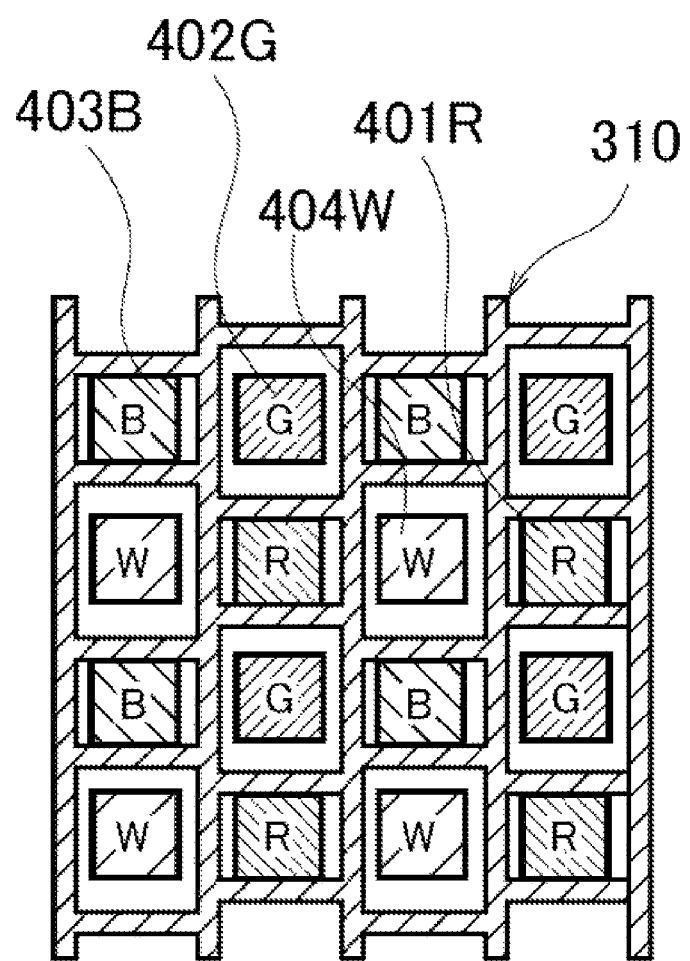
FIG. 5D is a plan view showing a positional relationship between the sub pixels and the assisting lines of the display device in the another embodiment according to the present invention.
Figure 6A:
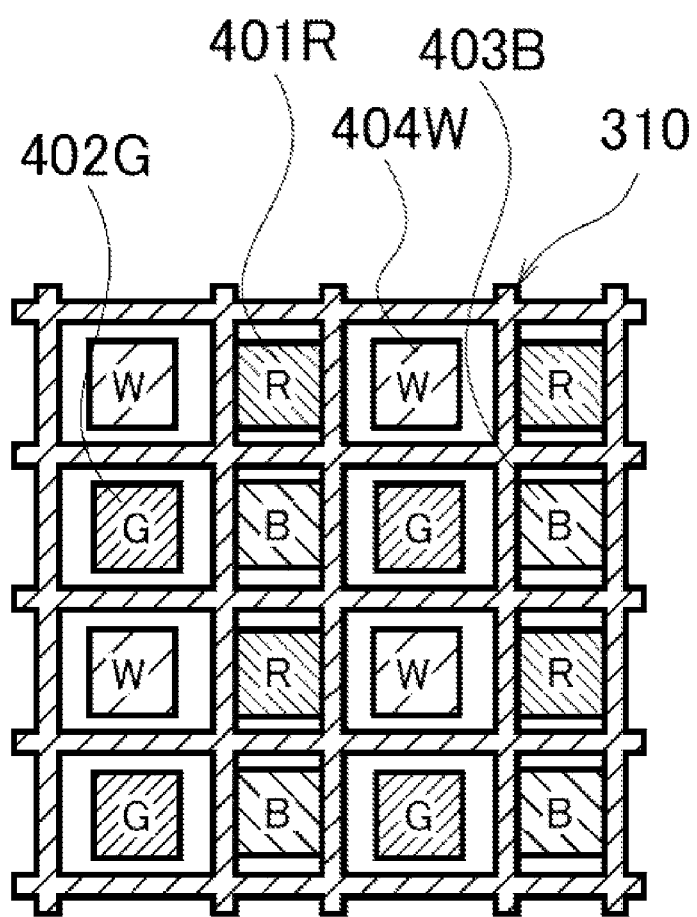
FIG. 6A is a plan view showing a positional relationship between sub pixels and assisting lines of a display device in still another embodiment according to the present invention.
Figure 6B:
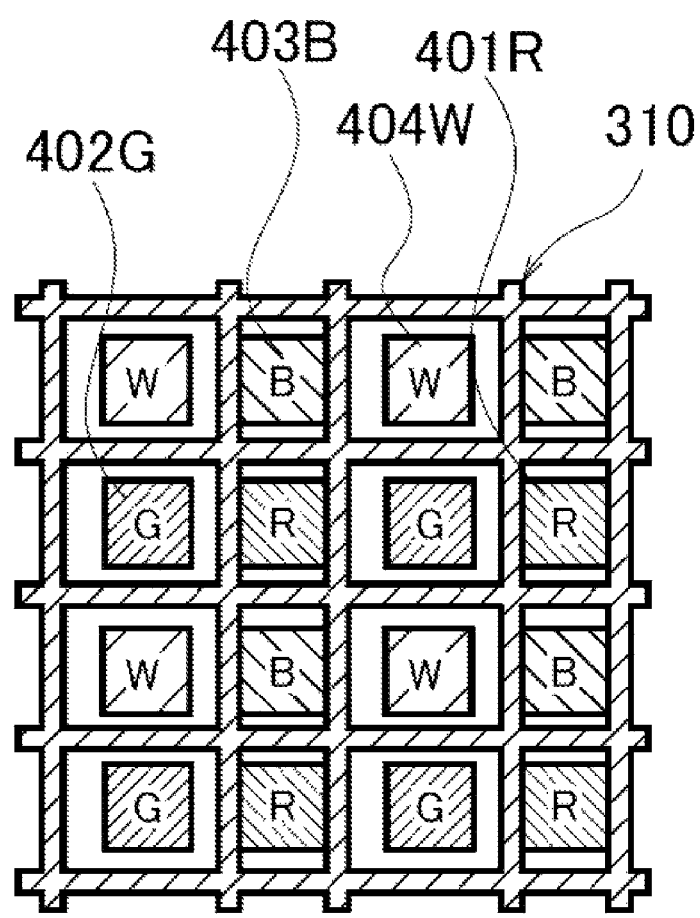
FIG. 6B is a plan view showing a positional relationship between the sub pixels and the assisting lines of the display device in the still another embodiment according to the present invention.
Figure 6C:
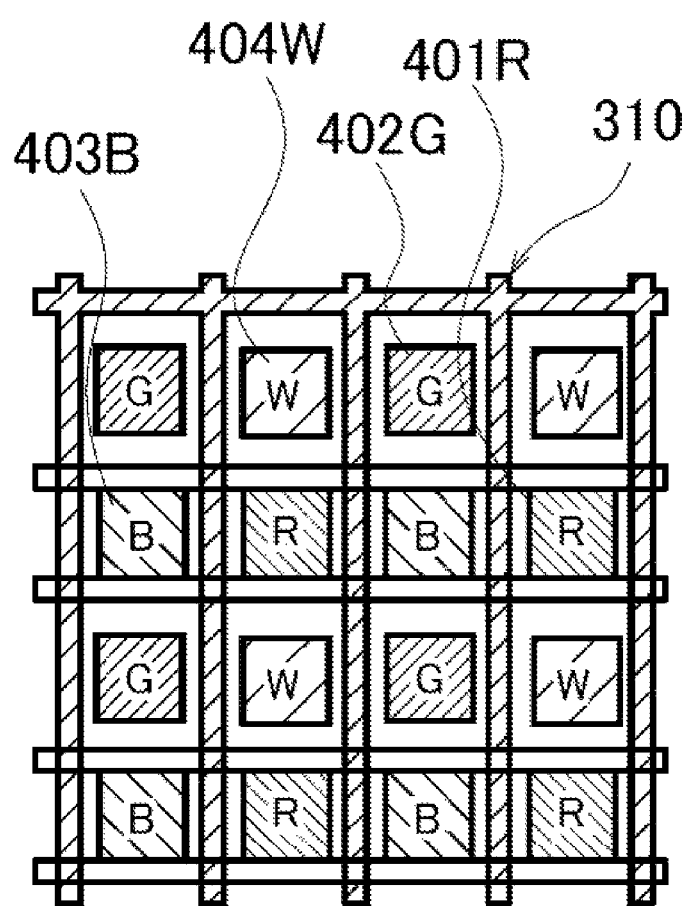
FIG. 6C is a plan view showing a positional relationship between the sub pixels and the assisting lines of the display device in the still another embodiment according to the present invention.

FIG. 4A and FIG. 4B show the positional relationship of the sub pixels and the assisting lines 310.

In the display device 100 in this embodiment, the sub pixels are located such that a distance between an assisting line 310 and an edge of the opening, of the bank 306, that is above the pixel electrode of a sub pixel having a first color strongly influenced by color mixing is longer than a distance between the assisting line 310 and an edge of the opening, of the banks 306, that is above a pixel electrode of a sub pixel having a second color weakly influenced by color mixing. Referring to FIG. 4A, distance X between assisting lines 310 having a sub pixel 402G therebetween is longer than distance Y between assisting lines 310 having a sub pixel 401R or a sub pixel 403B therebetween.

Such a positional relationship decreases the influence of the electrical color mixing. The first color strongly influenced by color mixing refers to an assembly of colors having a high relative luminosity factor, and is, for example, green, white or yellow. The second color weakly influenced by color mixing refers to an assembly of colors having a low relative luminosity factor, and is, for example, red or blue.

As shown in FIG. 4A, in the display device 100 in this embodiment, the assisting lines 310 are located in a lattice, and the sub pixels are located in the order of a red sub pixel 401R, a green sub pixel 402G, a blue sub pixel 403B and a white sub pixel 404W. The distance between the assisting lines 310 having the sub pixel 401R or 403B therebetween is substantially equal to the width of a light emitting area of the sub pixel 401R or 403B. The distance between the assisting lines 310 having the sub pixel 402G or 404W therebetween is longer by a certain width than the width of the light emitting area of the sub pixel 402G or 404W. Namely, for the sub pixels of colors having a high relative luminosity factor, the assisting lines 310 are provided at positions relatively far therefrom. For the sub pixels of colors having a low relative luminosity factor, the assisting lines 310 are provided at positions relatively close thereto. This embodiment merely provides an example. As shown in FIG. 4B, the assisting lines 310 may be provided only in a longitudinal direction. The red, green, blue and white sub pixels 401R, 402G, 403B and 404W may be located in any order, as long as the distance between the sub pixel 402G or 404W and the corresponding assisting lines 310 is longer than the distance between the sub pixel 401R or 403B and the corresponding assisting lines 310. The distance between the assisting lines 310 having the sub pixel 401R or the sub pixel 403B therebetween does not need to be substantially equal to the width of the light emitting area of the sub pixel 401R or the sub pixel 403B.

The assisting lines 310 extending in a direction perpendicular to the direction in which the sub pixels of the same color are located may be located at an equal interval. Such an arrangement uniformizes the characteristics.

In the display device 100 in this embodiment, the sub pixels of the same color are located adjacent to each other in the longitudinal direction. Therefore, the assisting lines 310 extending in a transverse direction are located so as to have an equal distance from the sub pixels thereabove and the sub pixels therebelow. Alternatively, in the case where the sub pixels of different colors are located adjacent to each other in the longitudinal direction, the assisting lines 310 extending in the transverse direction may be located so as to be closer to either the sub pixels thereabove or the sub pixels therebelow. In the case where, for example, the red or blue sub pixels 401R or 403B are located below the green or white sub pixels 402G or 404W, the assisting lines 310 extending in the transverse direction may be located so as to be closer to the red or blue sub pixels 401R or 403B.

As described above, in the display device 100 in this embodiment, the assisting lines 310 are located asymmetrically with respect to the sub pixels 402G and 404W of green and white having a high relative luminosity factor and to the sub pixels 401R and 403B of red and blue having a low relative luminosity factor. Specifically, the distance from the light emitting layers of the sub pixels 402G and 404W of green and white having a high relative luminosity factor to the assisting lines 310 is made longer than the distance from the light emitting layers of the sub pixels 401R and 403B of red and blue having a low relative luminosity factor to the assisting lines 310.

The common electrode 308 used as the cathode is formed of a material having a higher resistivity than that of the material of the assisting lines 310. In addition, the common electrode 308 is formed to have a preferable thickness such that the resistance value per unit distance in the transverse direction or per unit area size (sheet resistance value) of the common electrode 308 is higher than that of the assisting lines 310. Therefore, in the case where the sub pixels and the assisting lines are located in any of the above-described positional relationships, the combined resistance value of the common electrode 308 and the assisting lines 310 in the sub pixels 401R or 403B of red or blue having a low relative luminosity factor is lower than the combined resistance value of the common electrode 308 and the assisting lines 310 in the sub pixels 402G or 404W of green or white having a high relative luminosity factor. For this reason, while the sub pixels 401R or 403B of red or blue having a low relative luminosity factor emits light and the sub pixels 402G or 404W of green or white having a high relative luminosity factor do not emit light, the phenomenon that the current flows toward the green or white sub pixels 402G or 404W to cause the green or white sub pixels 402G or 404W to emit light is prevented. Meanwhile, the distance from the green or white sub pixels 402G or 404W to the assisting lines 310 is longer. Therefore, the combined resistance value of the common electrode 308 and the assisting lines 310 in the green or white sub pixels 402G or 404W is kept large. Therefore, while the green or white sub pixels 402G or 404W emit light and the red or blue sub pixels 401R or 403B do not emit light, the phenomenon that the current flows toward the red or blue sub pixels 401R or 403B to cause the red or blue sub pixels 401R or 403B to emit light is prevented.

Therefore, the display device 100 in this embodiment allows an optimum OLED element design to be used without sacrificing the efficiency, chromaticity or the like. As described above, the resistance value of the cathode provided on the light emitting element is intentionally made relatively high, the assisting lines formed of a material having a relatively low resistance value such as a metal material or the like is provided between the sub pixels, and the distance between the assisting lines and the light emitting elements is made different in accordance with the color of the sub pixels. Such a structure decreases the resistance value of the cathode, and also decreases the influence of the electrical color mixing.

Embodiment 2

FIG. 5A, FIG. 5B, FIG. 5C and FIG. 5D each show a positional relationship between the sub pixels and the assisting lines 310 of a display device 200 in embodiment 2. The display device 200 in embodiment 2 is different from the display device 100 in embodiment 1 on the following point. In the display device 200 in embodiment 2, the sub pixels 403B or 404W of green or white having a high relative luminosity factor and the sub pixels 401R or 403B of red or blue having a low relative luminosity factor are located alternately both in the longitudinal direction and the transverse direction. The sub pixels 403B and 404W of green and white having a high relative luminosity factor are located diagonally, and the sub pixels 401R and 403B of red and blue having a low relative luminosity factor are located diagonally. Except for this point, the display device 200 in embodiment 2 is the same as the display device 100 in embodiment 1.

With the display device 200 in this embodiment 2 having such a structure, the numerical aperture is improved while the distance between adjacent pixels is kept at a certain level. This is advantageous in providing high-definition display.

Embodiment 3

FIG. 6A, FIG. 6B, FIG. 6C and FIG. 6D each show a positional relationship between the sub pixels and the assisting lines 310 of a display device 300 in embodiment 3. The display device 300 in embodiment 3 is different from the display device 100 in embodiment 1 on the following point. In the display device 300 in embodiment 3, the sub pixels 403B or 404W of green or white having a high relative luminosity factor and the sub pixels 401R or 403B of red or blue having a low relative luminosity factor are located alternately in the transverse direction. The sub pixels 403B and 404W of green and white having a high relative luminosity factor are located in the same line in the longitudinal direction, and the sub pixels 401R and 403B of red and blue having a low relative luminosity factor are located in the same line in the longitudinal direction. Except for this point, the display device 300 in embodiment 3 is the same as the display device 100 in embodiment 1.

In the display device 300 in this embodiment 3 having such a structure, the colors having a high relative luminosity factor are adjacent to each other, and the colors having a low relative luminosity factor are adjacent to each other, in the longitudinal direction. Such a structure makes it unnecessary to locate the assisting lines 310 closer to either type of colors. Therefore, the assisting lines 310 are allowed to be located in a simple lattice, which provides an advantage that the processing is made easy.

Embodiment 4

FIG. 7A, FIG. 7B, FIG. 7C, FIG. 7D, FIG. 8A, FIG. 8B, FIG. 8C, FIG. 8D, FIG. 9A, FIG. 9B, FIG. 9C and FIG. 9D each show a positional relationship between the sub pixels and the assisting lines 310 of a display device 400 in embodiment 4. The display device 400 in embodiment 4, unlike the display device 100 in embodiment 1, includes sub pixels of three colors, namely, red, green and blue sub pixels 401R, 402G and 403B. Except for this point, the display device 400 in embodiment 4 is the same as the display device 100 in embodiment 1.

Figure 7A:
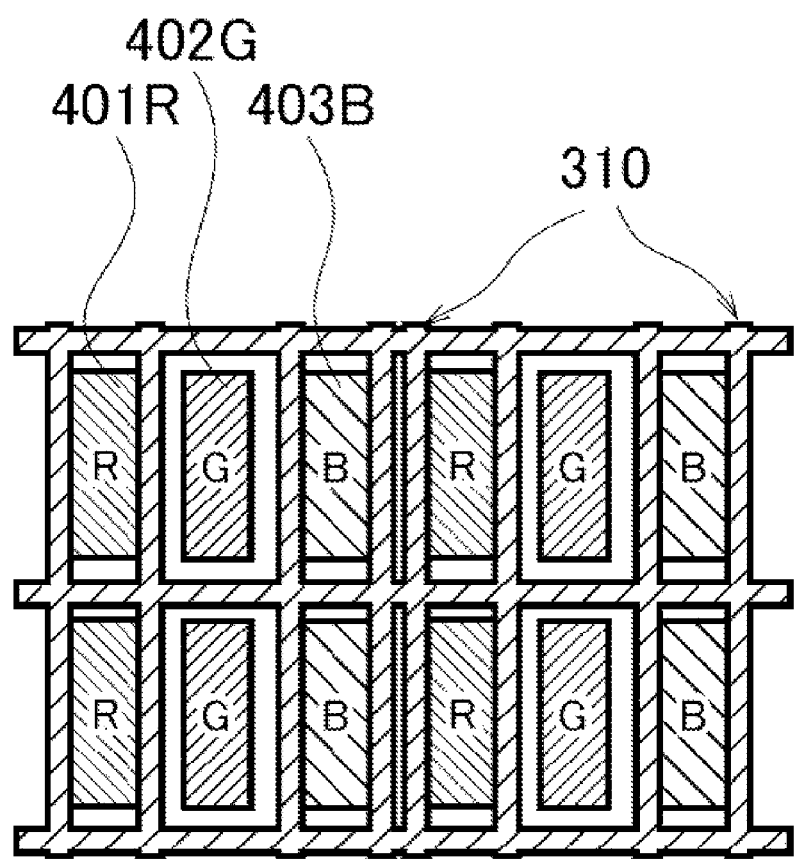
FIG. 7A is a plan view showing a positional relationship between sub pixels and assisting lines of a display device in yet another embodiment according to the present invention.
Figure 7B:
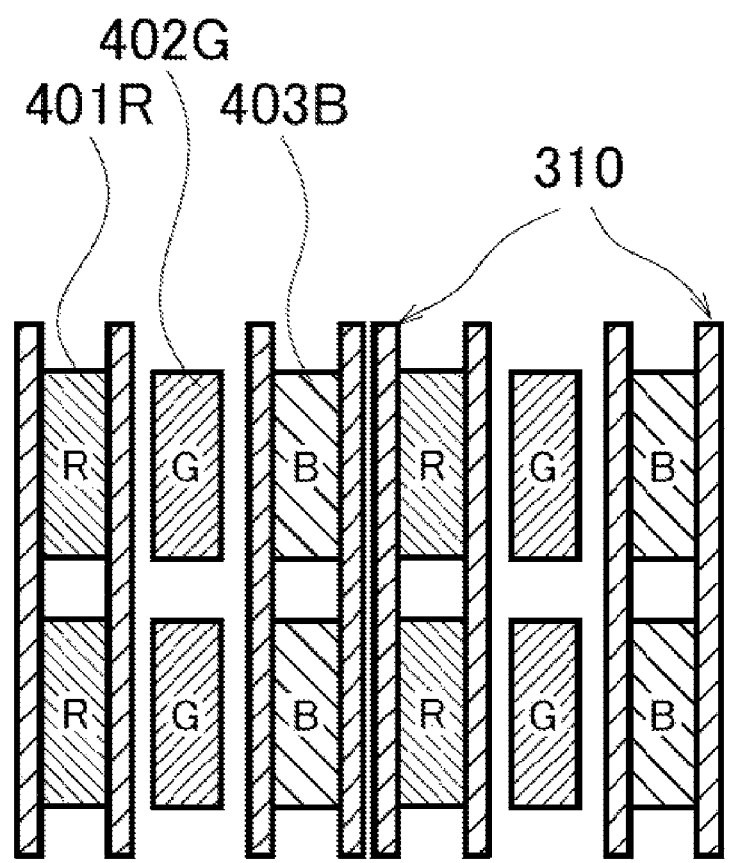
FIG. 7B is a plan view showing a positional relationship between the sub pixels and the assisting lines of the display device in the yet another embodiment according to the present invention.
Figure 7C:
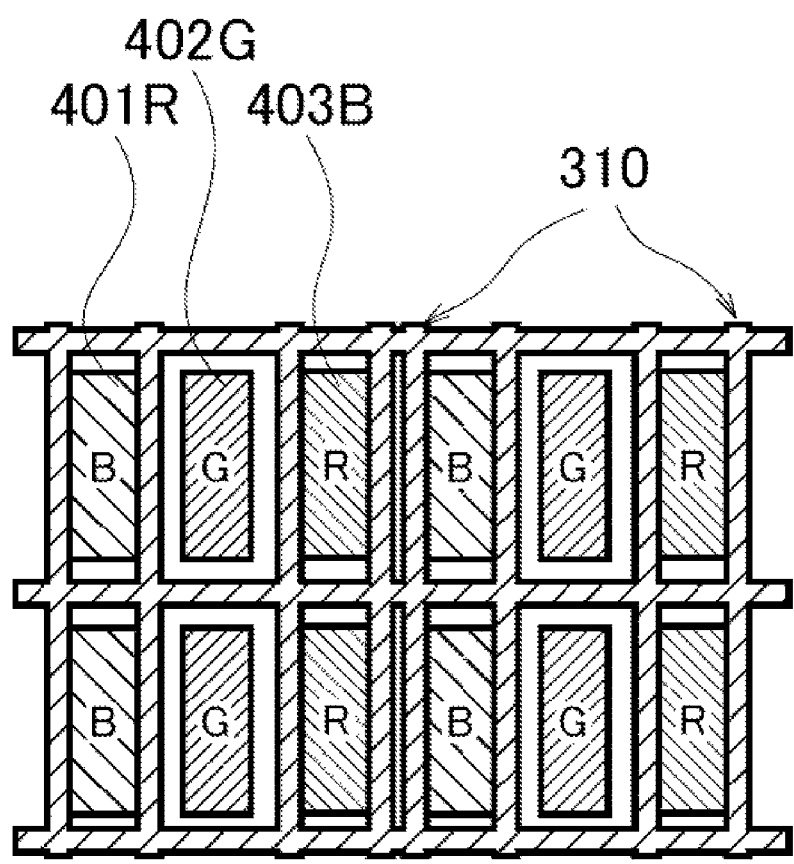
FIG. 7C is a plan view showing a positional relationship between the sub pixels and the assisting lines of the display device in the yet another embodiment according to the present invention.
Figure 7D:
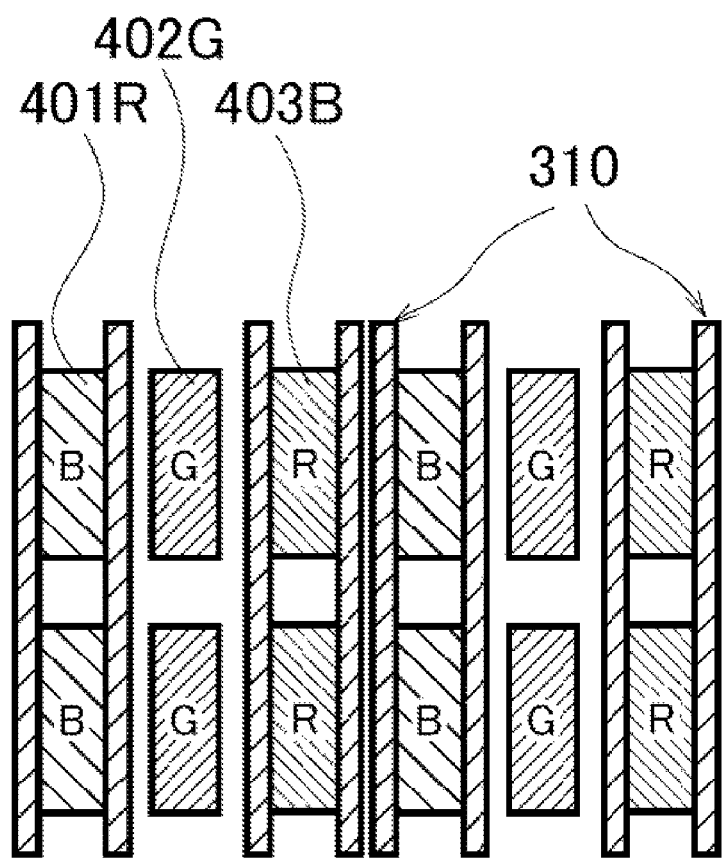
FIG. 7D is a plan view showing a positional relationship between the sub pixels and the assisting lines of the display device in the yet another embodiment according to the present invention.
Figure 9A:
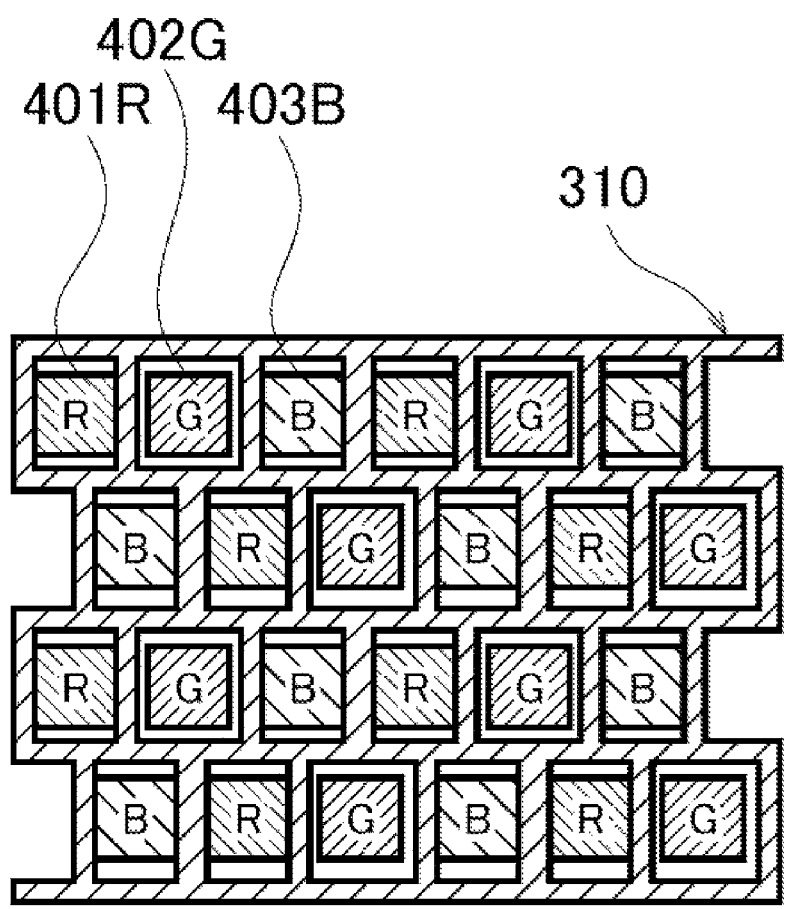
FIG. 9A is a plan view showing a positional relationship between the sub pixels and the assisting lines of the display device in the yet another embodiment according to the present invention.
Figure 9B:
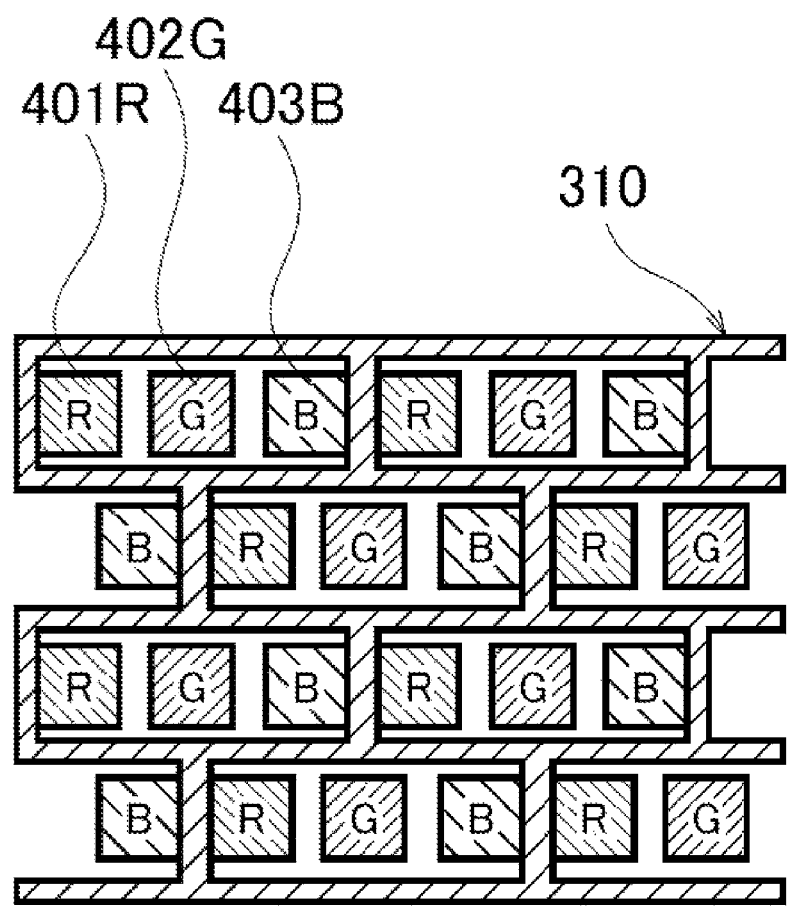
FIG. 9B is a plan view showing a positional relationship between the sub pixels and the assisting lines of the display device in the yet another embodiment according to the present invention.
Figure 9C:
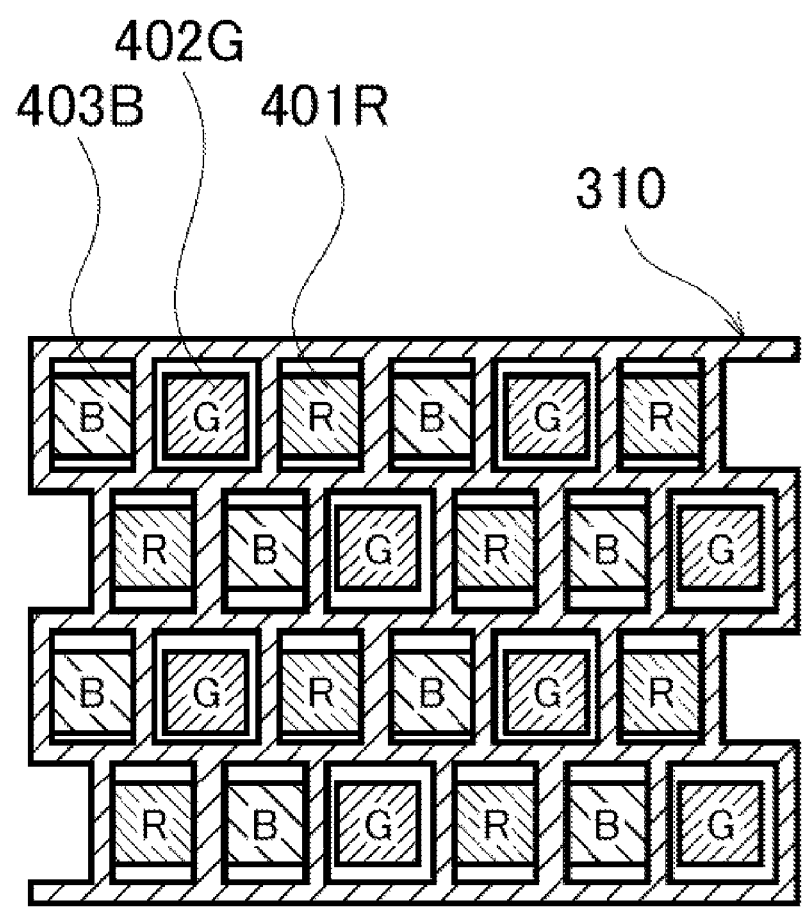
FIG. 9C is a plan view showing a positional relationship between the sub pixels and the assisting lines of the display device in the yet another embodiment according to the present invention.
Figure 9D:
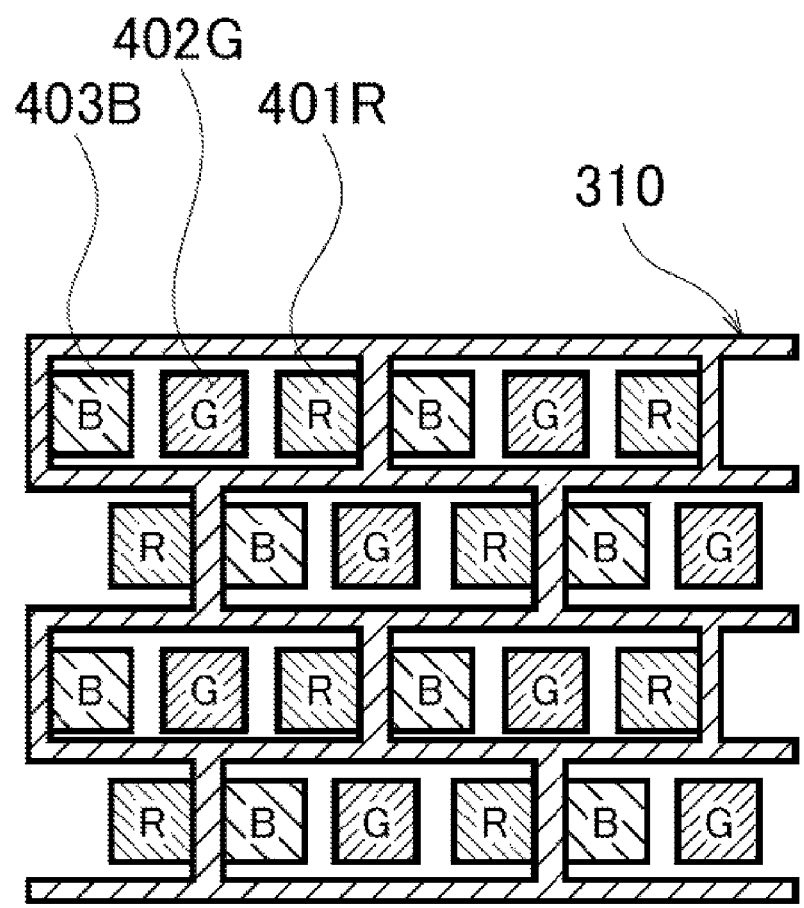
FIG. 9D is a plan view showing a positional relationship between the sub pixels and the assisting lines of the display device in the yet another embodiment according to the present invention.

Namely, in the display device 400 in embodiment 4 also, the assisting lines 310 may be located so as to have all the sub pixels therebetween as shown in FIG. 7A or FIG. 9A. Alternatively, as shown in FIG. 7B, the assisting lines 310 may be located in the longitudinal direction so as to have all the sub pixels therebetween, whereas no assisting lines 310 may be located in the transverse direction. As shown in FIG. 7C, FIG. 7D and FIG. 9C, the red, green and blue sub pixels 401R, 402G and 403B may be located in any order.

Figure 8A:
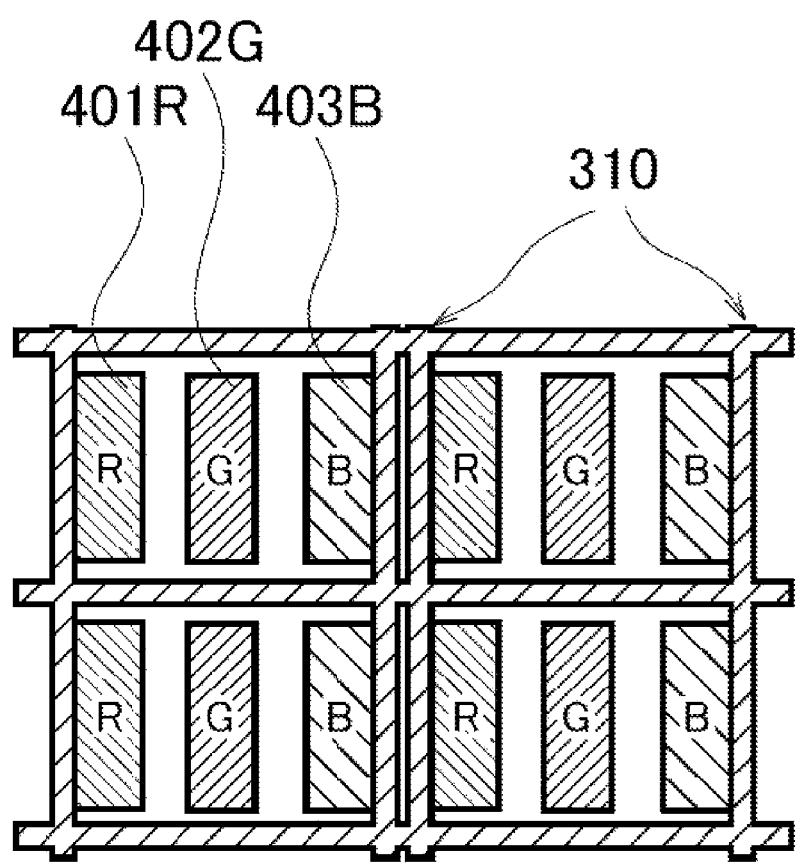
FIG. 8A is a plan view showing a positional relationship between the sub pixels and the assisting lines of the display device in the yet another embodiment according to the present invention.
Figure 8B:
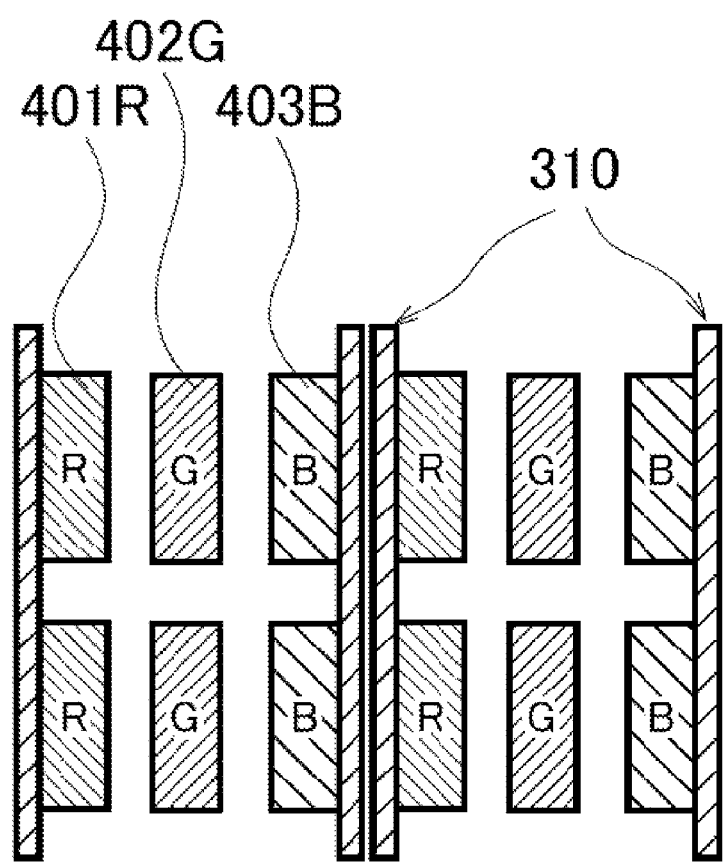
FIG. 8B is a plan view showing a positional relationship between the sub pixels and the assisting lines of the display device in the yet another embodiment according to the present invention.
Figure 8C:
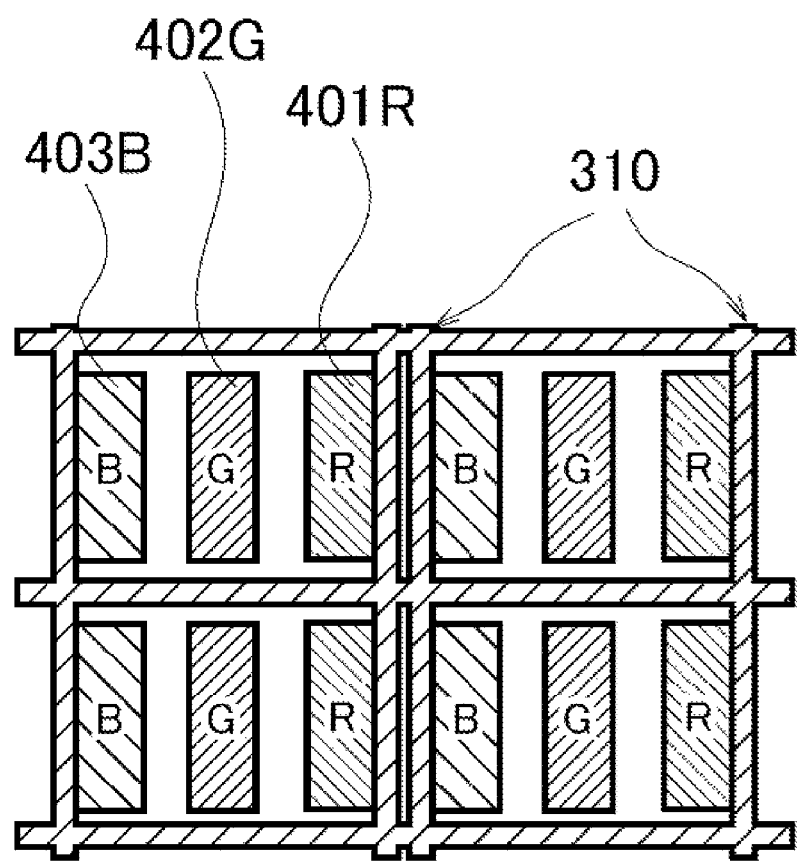
FIG. 8C is a plan view showing a positional relationship between the sub pixels and the assisting lines of the display device in the yet another embodiment according to the present invention.
Figure 8D:
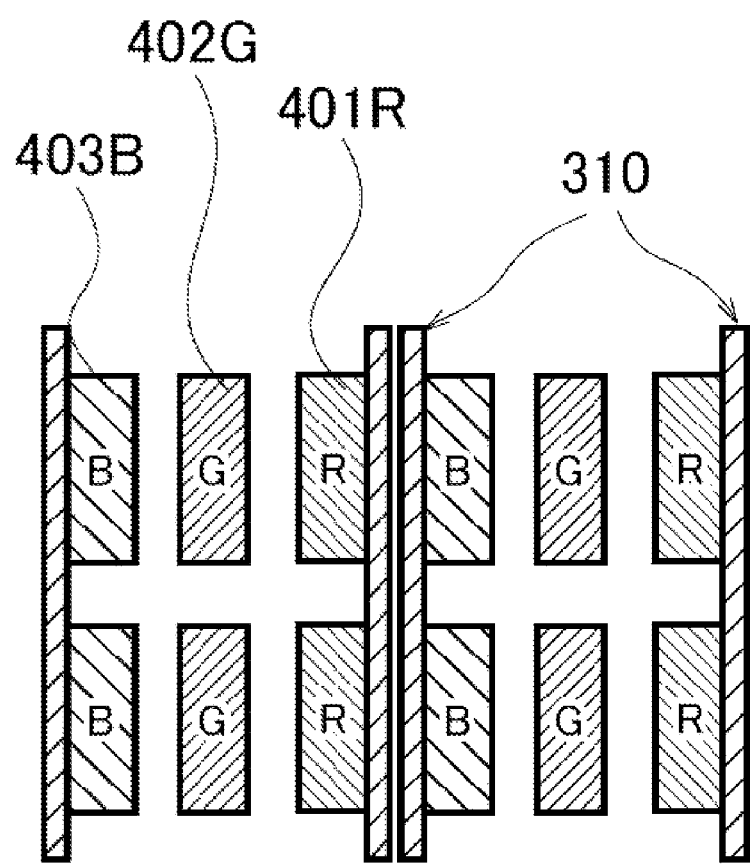
FIG. 8D is a plan view showing a positional relationship between the sub pixels and the assisting lines of the display device in the yet another embodiment according to the present invention.

As shown in FIG. 8A, FIG. 8C, FIG. 9B and FIG. 9D, the sub pixels of the three colors that are located in the order of the red sub pixel 401R, the green sub pixel 402G and the blue sub pixel 403B or in the order of the blue sub pixel 403B, the green sub pixel 402G and red sub pixel 401R, may be treated as one set, and the assisting lines 310 may be located so as to enclose each set of the sub pixels. Alternatively, as shown in FIG. 8B and FIG. 8D, the sub pixels of the three colors that are located in the order of the red sub pixel 401R, the green sub pixel 402G and the blue sub pixel 403B or in the order of the blue sub pixel 403B, the green sub pixel 402G and red sub pixel 401R, may be treated as one set, and the assisting lines 310 may be located in the longitudinal direction so as to have such sets of the sub pixels therebetween.

With the display device 400 in embodiment 4 having such a structure, it is not necessary to provide the assisting lines 310 such that the green sub pixels 402G located between the red sub pixels 401R and the blue sub pixels 403B are located between the assisting lines 310. A certain distance is provided from the light emitting layers of the sub pixels 402G and 404W of green and white having a high relative luminosity factor to the assisting lines 310, so that the line resistance of the green and white sub pixels 402G and 404W is higher than the line resistance of the sub pixels 401R and 403B of red and blue having a low relative luminosity factor. In this state, the voltage to be applied to the sub pixels 402G and 404W of green and white having a high relative luminosity factor is decreased. In this manner, the influence of the electrical color mixing is decreased. The display device 400 in embodiment 4 having such a structure provides the above-described effect while decreasing the number of the assisting lines 310 needed, and also is manufactured by a simpler process.

The present invention is not limited to any of the above-described embodiments, and the embodiments may be modified appropriately without departing from the gist of the present invention.

What is claimed is:

1. A display device, comprising:
   a display area including a plurality of pixels located in a matrix, the plurality of pixels including first sub pixels emitting light of a first color and second sub pixels emitting light of a second color, the second sub pixels being adjacent to the first sub pixels;
   wherein:
   the first sub pixels and the second sub pixels each include:
      a pixel electrode provided on a surface of an insulating layer; and
      a bank covering an edge of the pixel electrode and having an opening on the pixel electrode;
   the display device further comprises:
      an EL layer provided above the openings;
      a counter electrode provided to cover the EL layer; and
      a plurality of assisting lines formed in areas of the counter electrode between the first sub pixels and the second sub pixels, the areas not overlapping the openings of the banks as seen in a plan view;
   as seen in a cross-sectional view, regarding each of the first sub pixels and the second sub pixel adjacent thereto, a distance between an edge of the opening of the bank demarcating the first sub pixel and a corresponding assisting line, among the plurality of assisting lines, is longer than a distance between an edge of the opening of the bank demarcating the second sub pixel and the corresponding assisting line;
   the first color is green and the second color is red or blue;
   the pixels emitting light of green are located between the pixels emitting light of red and the pixels emitting light of blue; and
   no assisting lines are located between the pixels emitting light of red and the pixels emitting light of green, or between the pixels emitting light of green and the pixels emitting light of blue.

2. The display device according to claim 1, wherein the first color is green or white, and the second color is red or blue.

3. The display device according to claim 1, further comprising a sealing substrate provided above the plurality of assisting lines, with a filler being located between the sealing substrate and the plurality of assisting lines;
   wherein the sealing substrate includes color filters respectively corresponding to red, blue and green.

4. The display device according to claim 1, wherein the EL layer includes areas respectively colored red, blue and green.

5. The display device according to claim 1, wherein one of the second sub pixels has a width substantially equal to a distance between two assisting lines, among the plurality of assisting lines, and the one of the second sub pixels is provided therebetween.

6. The display device according to claim 1, wherein the plurality of assisting lines are located in a longitudinal direction or a transverse direction as seen in a plan view.

7. The display device according to claim 1, wherein the assisting lines, among the plurality of assisting lines, extending in a direction perpendicular to a direction of a line of the pixels of the same color are located at an equal interval.

8. The display device according to claim 1, wherein in a direction perpendicular to a direction of a line of the first sub pixels and the second sub pixels alternately located, the assisting lines are located closer to the second sub pixels.

9. A display device, comprising:
a display area including a plurality of pixels located in a matrix, the plurality of pixels including first sub pixels emitting light of a first color and second sub pixels emitting light of a second color, the second sub pixels being adjacent to the first sub pixels;
wherein:
the first sub pixels and the second sub pixels each include:
a pixel electrode provided on a surface of an insulating layer; and
a bank covering an edge of the pixel electrode and having an opening on the pixel electrode;
the display device further comprises:
an EL layer provided above the openings;
a counter electrode provided to cover the EL layer; and
a plurality of assisting lines formed in areas of the counter electrode, the areas not overlapping the openings of the banks as seen in a plan view;
as seen in a cross-sectional view, a distance between two assisting lines, among the plurality of assisting lines, having the first sub pixels therebetween is longer than a distance between two assisting lines, among the plurality of assisting lines, having the second sub pixels therebetween;
the first color is green and the second color is red or blue;
the pixels emitting light of green are located between the pixels emitting light of red and the pixels emitting light of blue; and
no assisting lines are located between the pixels emitting light of red and the pixels emitting light of green, or between the pixels emitting light of green and the pixels emitting light of blue.

10. The display device according to claim 9, wherein the first color is green or white, and the second color is red or blue.

11. The display device according to claim 9, further comprising a sealing substrate provided above the plurality of assisting lines, with a filler being located between the sealing substrate and the plurality of assisting lines;
wherein the sealing substrate includes color filters respectively corresponding to red, blue and green.

12. The display device according to claim 9, wherein the EL layer includes areas respectively colored red, blue and green.

13. The display device according to claim 9, wherein one of the second sub pixels has a width substantially equal to a distance between two assisting lines, among the plurality of assisting lines, and the one of the second sub pixels is provided therebetween.

14. The display device according to claim 9, wherein the plurality of assisting lines are located in a longitudinal direction or a transverse direction as seen in a plan view.

15. The display device according to claim 9, wherein the assisting lines, among the plurality of assisting lines, extending in a direction perpendicular to a direction of a line of the pixels of the same color are located at an equal interval.

16. The display device according to claim 9, wherein in a direction perpendicular to a direction of a line of the first sub pixels and the second sub pixels alternately located, the assisting lines are located closer to the second sub pixels.

* * * * *